(12) United States Patent
Ebihara

(10) Patent No.: US 10,498,322 B1
(45) Date of Patent: Dec. 3, 2019

(54) COMPARATOR OUTPUT CIRCUITRY FOR SINGLE SLOPE ANALOG TO DIGITAL CONVERTER

(71) Applicant: OmniVision Technologies, Inc., Santa Clara, CA (US)

(72) Inventor: Hiroaki Ebihara, Santa Clara, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 0 days.

(21) Appl. No.: 16/275,107

(22) Filed: Feb. 13, 2019

(51) Int. Cl.
*H03K 5/24* (2006.01)
*H04N 5/378* (2011.01)
*H03M 1/34* (2006.01)
*H03M 1/56* (2006.01)

(52) U.S. Cl.
CPC ............ *H03K 5/2481* (2013.01); *H03M 1/34* (2013.01); *H03M 1/56* (2013.01); *H04N 5/378* (2013.01)

(58) Field of Classification Search
CPC ........ H03K 5/2481; H03M 1/34; H03M 1/56; H04N 5/378; H03N 5/3745

USPC .......................................... 341/155, 165, 169
See application file for complete search history.

(56) References Cited

U.S. PATENT DOCUMENTS 8,749,424 B2 6/2014 Ueno
10,348,992 B2 * 7/2019 Sakakibara

* cited by examiner

*Primary Examiner* — Khai M Nguyen
(74) *Attorney, Agent, or Firm* — Christensen O'Connor Johnson Kindness PLLC

(57) ABSTRACT

An output circuit for use with a comparator includes a first transistor having a control terminal coupled to receive an output signal from a first stage of the comparator. A second transistor is coupled between the first transistor and a reference voltage. The second transistor has a control terminal coupled to receive a first reset signal. The second transistor is coupled to precharge a first output node of the first transistor between the first and second transistors to the reference voltage prior to a comparison operation of the comparator. An output stage has an input node coupled to the first output node. The output stage is coupled to generate an output voltage of the output circuit at an output node of the output stage in response to the first output node.

26 Claims, 9 Drawing Sheets

US 10,498,322 B1

COMPARATOR OUTPUT CIRCUITRY FOR SINGLE SLOPE ANALOG TO DIGITAL CONVERTER

BACKGROUND INFORMATION

Field of the Disclosure

This disclosure relates generally to image sensors, and in particular but not exclusively, relates to comparator output circuitry for use in analog to digital conversion in an image sensor.

Background

Image sensors have become ubiquitous. They are widely used in digital still cameras, cellular phones, security cameras, as well as, medical, automobile, and other applications. The technology used to manufacture image sensors has continued to advance at a great pace. For example, the demands of higher resolution and lower power consumption have encouraged the further miniaturization and integration of these devices.

Image sensors conventionally receive light on an array of pixels, which generates charge in the pixels. The intensity of the light may influence the amount of charge generated in each pixel, with higher intensity generating higher amounts of charge. The charge may be converted into a digital representation of the charge by the image sensor based on a comparison to a reference voltage signal. The comparison may conventionally be performed by a comparator, which provides an output as the digital representation of the charge.

Comparators having three stages are often utilized for a single slope analog to digital converter (ADC) in a CMOS image sensor (CIS). Column level ADCs are widely used in commercial products because the area, power, and performance of these ADCs are well balanced. In addition to column level ADCs, area and/or pixel level ADCs may also be utilized in image sensors. It is appreciated that in column, area, and/or pixel level ADCs, the comparator needs to be small because a large number of comparators are needed. As such, the space available for each comparator in image sensors becomes increasingly limited as image sensor resolutions increase.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

Figure 1:
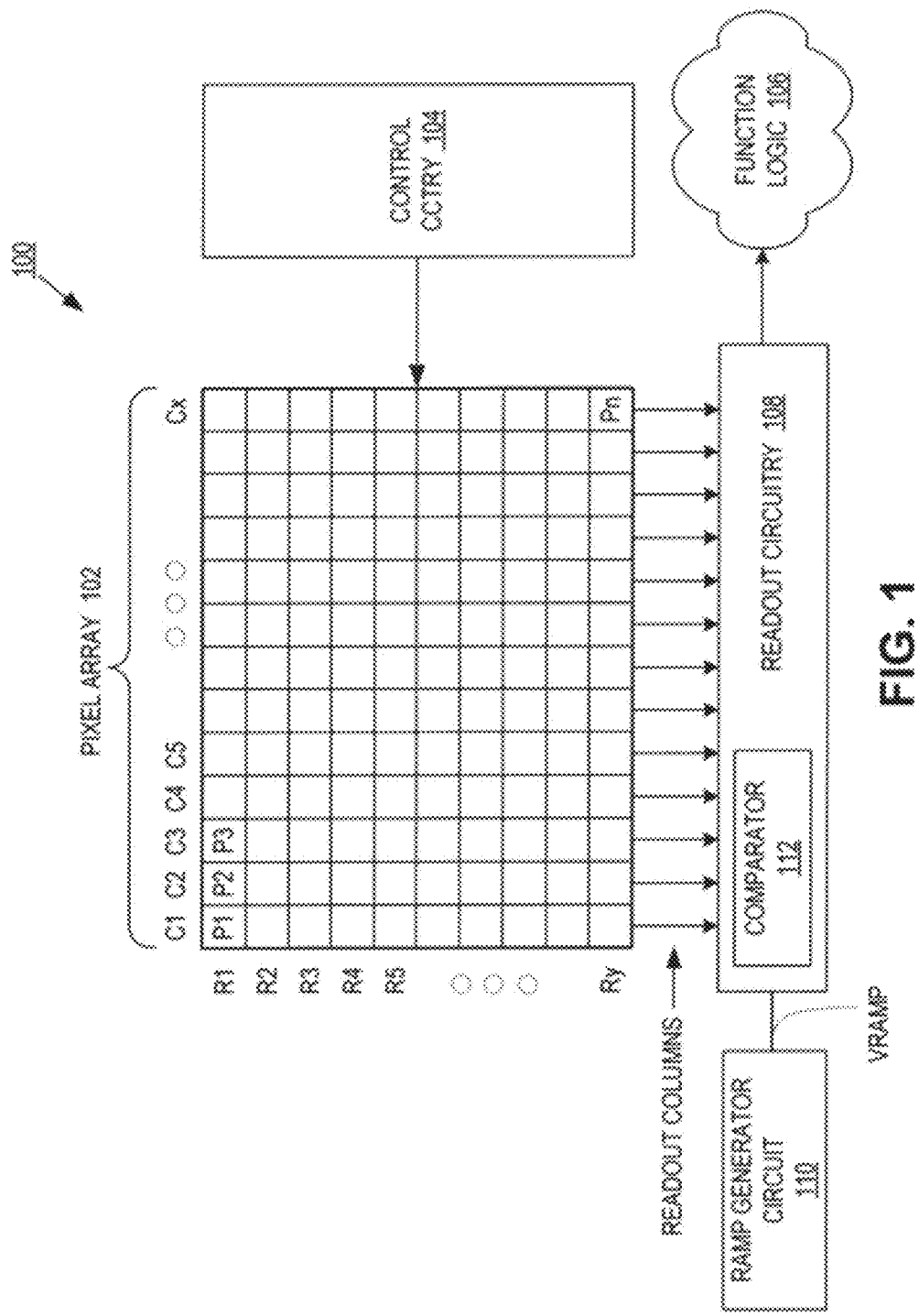
FIG. 1 illustrates one example of an imaging system in accordance with the teachings of the present invention.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present invention. Also, common but well-understood elements that are useful or necessary in a commercially feasible embodiment are often not depicted in order to facilitate a less obstructed view of these various embodiments of the present invention.

DETAILED DESCRIPTION

Examples of an apparatus and method for output circuitry used with a comparator in an image sensor analog to digital converter are described herein. In the following description, numerous specific details are set forth to provide a thorough understanding of the examples. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one example" or "one embodiment" means that a particular feature, structure, or characteristic described in connection with the example is included in at least one example of the present invention. Thus, the appearances of the phrases "in one example" or "in one embodiment" in various places throughout this specification are not necessarily all referring to the same example. Furthermore, the particular features, structures, or characteristics may be combined in any suitable manner in one or more examples.

Throughout this specification, several terms of art are used. These terms are to take on their ordinary meaning in the art from which they come, unless specifically defined herein or the context of their use would clearly suggest otherwise. It should be noted that element names and symbols may be used interchangeably through this document (e.g., Si vs. silicon); however, both have identical meaning.

FIG. 1 illustrates one example of an imaging system 100 in accordance with an embodiment of the present disclosure. Imaging system 100 includes pixel array 102, control circuitry 104, readout circuitry 108, and function logic 106. In one example, pixel array 102 is a two-dimensional (2D) array of photodiodes, or image sensor pixels (e.g., pixels P1, P2, . . . , Pn). As illustrated, photodiodes are arranged into rows (e.g., rows R1 to Ry) and columns (e.g., column C1 to Cx) to acquire image data of a person, place, object, etc., which can then be used to render a 2D image of the person, place, object, etc. However, photodiodes do not have to be arranged into rows and columns and may take other configurations.

In one example, after each image sensor photodiode/pixel in pixel array 102 has acquired its image data or image charge, the image data is readout by readout circuitry 108 and then transferred to function logic 106. Readout circuitry 108 may be coupled to read out image data from the plurality of photodiodes in pixel array 102. In various examples, readout circuitry 108 may include amplification circuitry, analog to digital (ADC) conversion circuitry, or otherwise. In some embodiments, one or more comparators 112 may be included for each of the readout columns. The one or more comparators 112 may be included in a respective analog to digital converter (ADC) included in the readout circuitry 108, for example. Function logic 106 may simply store the image data or even manipulate the image data by applying post image effects (e.g., crop, rotate, remove red eye, adjust brightness, adjust contrast, or otherwise). In one example, readout circuitry 108 may readout a row of image data at a time along readout column lines (illustrated) or may readout the image data using a variety of other techniques (not illustrated), such as a serial readout or a full parallel readout of all pixels simultaneously.

To perform ADC, for example, the readout circuitry 108 may receive a reference voltage VRAMP from a ramp generator circuit 110. VRAMP may be received by the comparator 112, which may also receive image charge from a pixel of the pixel array 102. The comparator 112 may determine a digital representation of the image charge based on a comparison of VRAMP to the image charge voltage level. In one example, the output circuitry of comparator 112 transitions from a first state to a second state when the input VRAMP voltage reaches the input image charge voltage level. In other words, this "flipping point" of the output circuitry of comparator 112, which may also be referred to as the set point, may occur when comparator 112 detects when the reference voltage level VRAMP is equal to the image charge voltage level, and as a result the output of the comparator 112 flips from a logic "1" to a logic "0", for example, or vice versa.

In one example, control circuitry 104 is coupled to pixel array 102 to control operation of the plurality of photodiodes in pixel array 102. For example, control circuitry 104 may generate a shutter signal for controlling image acquisition. In one example, the shutter signal is a global shutter signal for simultaneously enabling all pixels within pixel array 102 to simultaneously capture their respective image data during a single acquisition window. In another example, the shutter signal is a rolling shutter signal such that each row, column, or group of pixels is sequentially enabled during consecutive acquisition windows. In another example, image acquisition is synchronized with lighting effects such as a flash.

In one example, imaging system 100 may be included in a digital camera, cell phone, laptop computer, or the like. Additionally, imaging system 200 may be coupled to other pieces of hardware such as a processor (general purpose or otherwise), memory elements, output (USB port, wireless transmitter, HDMI port, etc.), lighting/flash, electrical input (keyboard, touch display, track pad, mouse, microphone, etc.), and/or display. Other pieces of hardware may deliver instructions to imaging system 100, extract image data from imaging system 100, or manipulate image data supplied by imaging system 100.

Figure 2A:
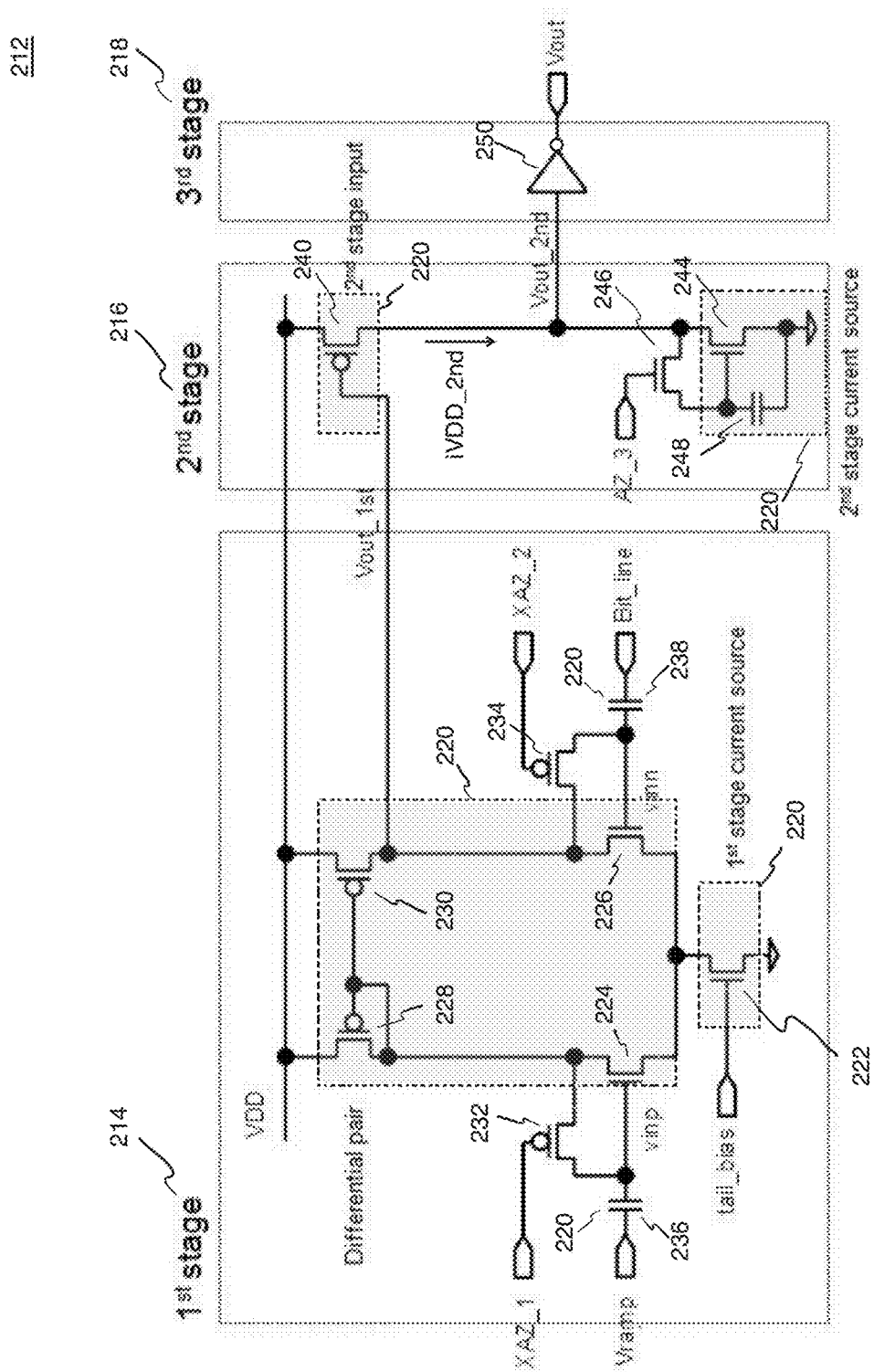
FIG. 2A shows an example of a comparator with output stages for use with an analog to digital converter in an image sensor.

FIG. 2A is a schematic illustrating one example of a comparator 212. It is noted that comparator 212 of FIG. 2A may be an example of comparator 112 of FIG. 1, and that similarly named and numbered elements referenced below are coupled and function similar to as described above. As shown in the depicted example, comparator 212 includes a first stage 214, and output circuitry including a second stage 216 and a third stage 218. The output circuitry of comparator 212 may provide an output signal Vout in response to a comparison of an image charge signal received on the Bit_line input to a reference voltage signal Vramp received on the Vramp input. The output signal Vout may be used by the imaging system 100 to when providing a digital representation of the received image charge signal. In the example depicted in FIG. 2A, it is noted that the components within the regions 220 occupy a large area, so that reducing the size of the components is important for a single slope ADC. It is noted that the regions 220 are labeled as including AC coupling capacitors 236 and 238, a differential pair and a 1st stage current source in the first stage 214, and a 2nd stage input and a 2nd stage current source in the second stage 216 of the output circuitry.

As shown in the illustrated example, the first stage 214 of comparator 212 includes an NMOS tail transistor 222 coupled between a reference voltage, such as ground, and two NMOS input transistors 224 and 226. The NMOS tail transistor 222 may be considered a 1st stage current source. The two NMOS input transistors 224 and 226 may be coupled in parallel between the NMOS tail transistor 222 and two respective PMOS transistors 228 and 230. The two PMOS transistors 228 and 230 may be coupled in parallel between the two NMOS input transistors 224 and 226 and a reference voltage, which may be VDD. In the example, the two PMOS transistors 228 and 230 are coupled together by their gates. PMOS transistors 228 and 230 and NMOS transistors 224 and 26 may be considered a differential pair.

Additionally, the comparator 212 may include two auto-zero switches 232 and 234, coupled between gates of respective ones of the two NMOS input transistors 224 and 226 and the drain sides of the same NMOS input transistors 224 and 226. In some embodiments, two AC coupling capacitors 236 and 238 may be included to capacitively couple their respective inputs Vramp and Bit_line to the gates of the two NMOS input transistors 224 and 226. In the depicted example, the gate input of NMOS transistor 224 is labeled vinp, and the gate input of NMOS transistor 226 is labeled vinn.

The comparator 212 may be described as having a reference voltage input side and a bit line (e.g., image charge) input side. The reference voltage input side may receive a reference voltage Vramp, and the bit line input side may receive an image charge voltage signal Bit_line. The reference voltage input side may include one of the NMOS input transistors 224, auto-zero switch 232, and one of the PMOS transistors 228. In the illustrated example, the gate of the PMOS transistor 228 of the reference voltage input side is coupled to a drain of the same transistor 228, which results in the gate both PMOS transistors 228 and 230 being coupled to the drain of PMOS transistor 228. The image charge input side may include one of the NMOS transistors 226, auto-zero switch 234, and one of the PMOS transistors 230. The NMOS tail transistor 222 may be coupled to receive a tail bias voltage at a gate terminal and the NMOS tail transistor 222 supplies constant current.

In the illustrated example, the first stage 214 provides an output Vout_1st from the node between P transistor 230 and N transistor 226 to the output circuitry, which in the example includes second stage 216 and a third stage 218. In response to receiving the output Vout_1st from the first stage 214, second stage 216 provides a second output Vout_2nd to the third stage 218. In the example, the third stage 218 is illustrated as an inverter 250 to generate the output Vout. It is appreciated that in other examples, a buffer circuit may be used instead of inverter 250 for the third stage 218, depending on the desired polarity of the output Vout and/or the polarity of Vout_2nd.

In operation, the first stage 214 may be biased to flip (e.g., change the level of Vout_1st) in response to a comparison between the input Vramp voltage and the input image charge voltage signal on the Bit_line input. The second stage 216 of comparator 212 includes an input PMOS transistor 240, which may be considered the 2nd stage input, a reference input transistor 244, a capacitor 248, and a control switch 246. The control switch 246 is coupled between a gate and a drain of the reference input transistor 244 to auto-zero the same. The control switch 246 may be enabled in response to the AZ_3 signal, so that the drain and the gate of the NMOS transistor 244 are shorted together, such that the NMOS transistor 244 is biased to draw the same current as the PMOS input transistor 240 outputs. As such, the capacitor 248 may be charged and set to the bias voltage with which the NMOS transistor 244 draws the same current as the PMOS input device 240. In this way, the reference input transistor 244 may provide the voltage Vout_1st as the reset point of the second stage 216. The 3rd stage 218 has an output node at which Vout is generated in response to the input received at the input node of 3rd stage 218 from Vout_2nd.

Figure 2B:
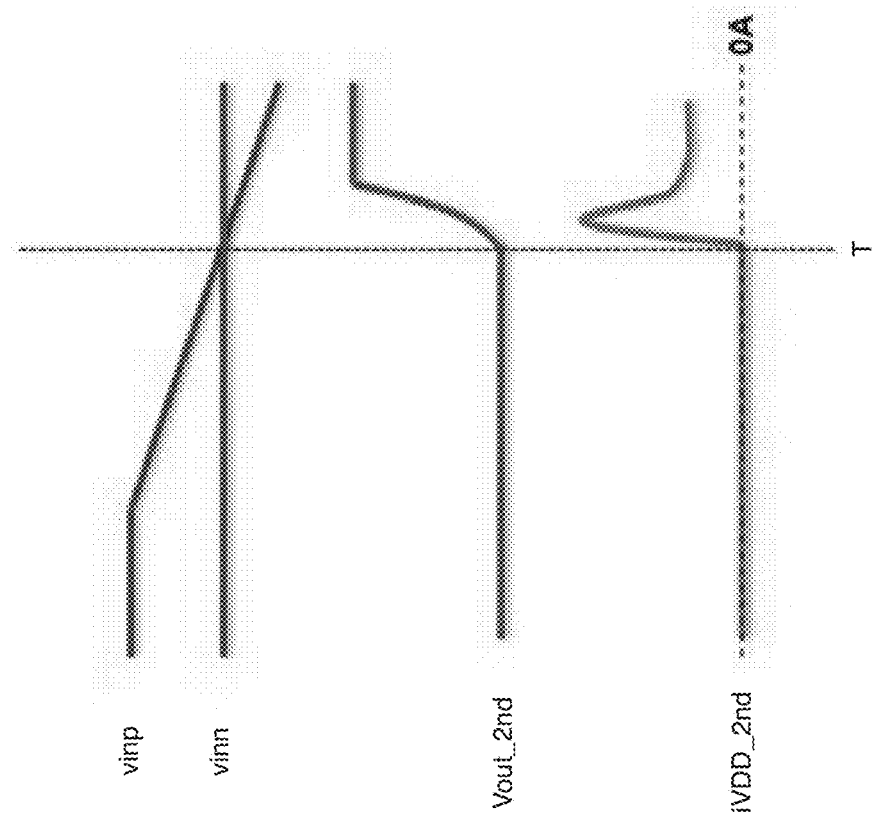
FIG. 2B is a timing diagram that illustrates some of the signals in a comparator as illustrated in FIG. 2A during an analog to digital conversion.

FIG. 2B is a timing diagram that illustrates some of the signals in comparator 212 as illustrated in FIG. 2A during an analog to digital conversion. As shown, the Vramp signal is received at the vinp input of transistor 224, and is compared to the Bit_line signal received at the vinn input of transistor 226. When the vinp signal reaches the vinn signal at time T, the transistor 240 in the 2nd stage input begins to turn on, which causes the Vout_2nd voltage to begin rising and the iVDD_2nd current to spike after time T as shown. One of the challenges illustrated in FIG. 2B occurs with respect to the current variation of the iVDD_2nd in the second stage 216. In particular, when the comparator 212 begins to flip at time T as shown, there is a current spike in iVDD_2nd that causes noise on the power and/or ground lines, which can also result in unwanted H-banding.

There are a number of factors that can cause the current spike in iVDD_2nd as shown. One factor is caused by the DC current of the 2nd stage current source, which in the depicted example includes transistor 244 and capacitor 248, which is set to be drawn. When Vout_2nd is low, the 2nd stage current source doesn't draw any current, but when Vout_2nd is high, the 2nd stage current source draws current, which is set to be drawn when AZ_3 turns to low. The other factor is caused by the iVDD_2nd current needed in order to charge the capacitance on the Vout_2nd output of the second stage 216. Thus, in order to reduce the amount of iVDD_2nd current needed in order to charge capacitances coupled to Vout_2nd, it is appreciated that the capacitance on the Vout_2nd output of the second stage 216 should be as small as possible.

It is also noted that another approach to reduce the current variation caused by turning on the 2nd stage current source would be to leave the 2nd stage current source on always by clamping Vout_2nd before the comparator makes a decision so that there is no current variation by turning on the current source. However, a disadvantage with this approach is that current consumption will be larger due to the 2nd current source always being on. Moreover, the capacitance on the Vout_2nd output of the second stage 216 as well as circuit area cannot be reduced, which is also problematic.

Figures 3A, 3B:
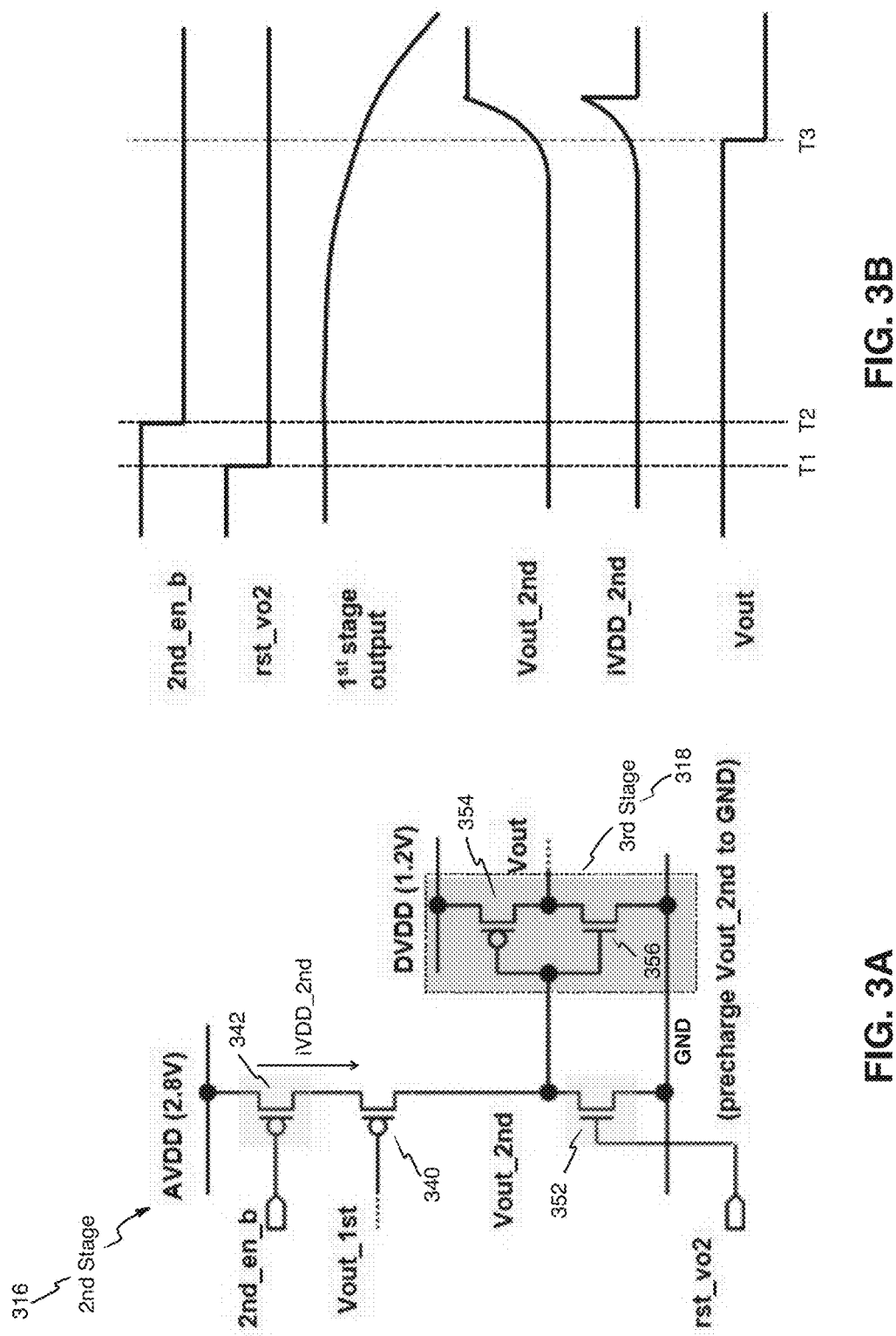
FIG. 3A is a schematic illustrating one example of output circuitry of a comparator including a second stage and a third stage in accordance with the teachings of the present invention.
FIG. 3B is a timing diagram that illustrates some of the signals in a second stage and a third stage as illustrated in FIG. 3A during an analog to digital conversion in accordance with the teachings of the present invention.

FIG. 3A is a schematic illustrating one example of output circuitry of a comparator including a second stage 316 and a third stage 318 in accordance with the teachings of the present invention. It is appreciated that second stage 316 and third stage 318 are additional or alternate examples of second stage 216 and third stage 218 of FIG. 2A, and that similarly named and numbered elements referenced below are coupled and function similar to as described above. As illustrated in FIG. 3A, one way to reduce area, power consumption, and current variation of the 2nd stage in accordance with the teachings of the present invention is to remove 2nd stage current source (i.e., transistor 244 and capacitor 248 of FIG. 2A), and instead pre-charge the second stage 316 output Vout_2nd (e.g., precharge Vout_2nd to ground) prior to the analog to digital conversion.

To illustrate, the example depicted in FIG. 3A shows that the second stage 316 includes a PMOS transistor 342 coupled to a first supply voltage AVDD (e.g., 2.8 V). The control terminal or gate terminal of transistor 342 is coupled to receive a second stage enable signal 2nd_en_b. A PMOS transistor 340 is coupled to transistor 342. The transistor 342 is configured to couple transistor 340 to the first supply voltage AVDD in response to the second stage enable signal 2nd_en_b. The control terminal or gate terminal of transistor 340 is coupled to receive the output from the first stage, Vout_1st. A reset transistor 352 is coupled to the transistor 340. The output of the second stage, Vout_2nd, is the output node of transistor 340, which is the node between transistors 340 and 352. The control terminal or gate of transistor 352 is coupled to receive a reset signal rst_vo2 to precharge the Vout_2nd output to ground prior to the analog to digital conversion. The PMOS transistor 342 is used to cut the current iVDD_2nd when it's not necessary. In some configurations, the PMOS transistor 342 can be removed. In this case, Vout_1st can be controlled to be high to turn off the transistor 342 to cut the current iVDD_2nd.

The third stage 318 is an output stage of the comparator. In the depicted example, the third stage 318 is implemented with an inverter including a PMOS transistor 354 and an NMOS transistor 356 coupled between a second supply voltage DVDD (e.g., 1.2 V) and ground. As illustrated, in one example, the second supply voltage DVDD is less than the first supply voltage AVDD. The control terminals or gate terminals of transistors 354 and 356 are the input node of 3rd stage 318, and are coupled to receive the Vout_2nd output of the second stage 316, and the output node of the third stage 354 is configured to generate the Vout output of the comparator at the drain terminals of transistors 354 and 356 as shown. In an alternate example, it is appreciated that the output stage could be implemented with a buffer circuit instead of an inverter circuit and still enjoy the benefits of the teachings of the present invention.

In operation, all of the 2nd stage current iVDD_2nd can now be utilized to charge the Vout_2nd voltage so that 2nd stage current iVDD_2nd can be minimized. In addition, the capacitance at the Vout_2nd output of the second stage 316 can now be reduced because the current source, which was the largest component on the 2nd stage 216 in FIG. 2A has now been removed, so that routing of Vout_2nd can now be much shorter due to the removal of the current source as illustrated in FIG. 2A. Furthermore, the area can be much smaller because the additional transistors 342 and 352 are switches, and can therefore be very small, which reduces the required area.

FIG. 3B is a timing diagram that illustrates some of the signals in second stage 316 and third stage 318 as illustrated in FIG. 3A during an analog to digital conversion in accordance with the teachings of the present invention. As shown, prior to time T1, the 2nd_en_b signal is high, which turns off transistor 342 and disables the second stage 316. At this time, the reset signal rst_vo2 is also high, which turns on the transistor 352 to precharge the Vout_2nd node to ground (GND) prior to the analog to digital conversion. Thus, prior to the analog to digital conversion, the Vout_2nd output and the iVDD_2nd current are zero, and the output of the inverter of the third stage 318 is high.

At time T2, the 2nd_en_b signal transitions from high to low, which turns on transistor 342 to enable the second stage 316, and therefore the output stage is ready to receive the signal from the 1st stage to make a comparison for analog to digital conversion.

At time T3, the 1st stage output (e.g., Vout_1st) begins to flip in response to a comparison operation of the comparator, which causes the Vout_2nd voltage and the iVDD_2nd current to begin to rise at shown. In addition, the output of the inverter of the $3^{rd}$ stage Vout transitions from a logic high to logic low indicating that the comparator has flipped in accordance with the teachings of the present invention.

It is noted that one of the challenges presented with the example second stage 316 as illustrated in FIG. 3A is associated with the gain of 2nd stage 316, and therefore with the power supply rejection ratio (PSRR) of DVDD voltage supply, which affect the 3rd stage output Vout. In particular, as shown in FIG. 3B, the transitions of the Vout_2nd voltage and the iVDD_2nd current at time T3 begin gradually at first such that the slopes of the transitions start out smaller before the slopes become larger.

Figure 3D:
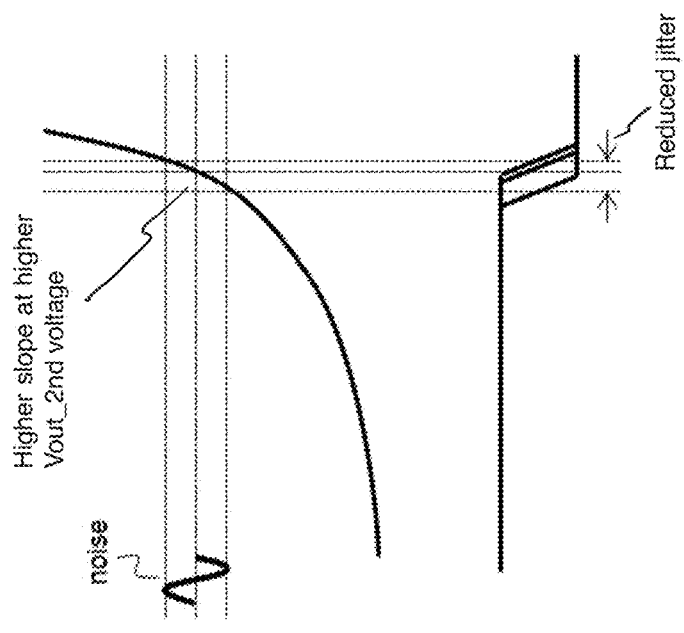
FIG. 3D is a timing diagram that illustrates that when Vout is set to transition at a higher voltage, the noise at the Vout_2nd output causes less output jitter at Vout.
Figure 3C:
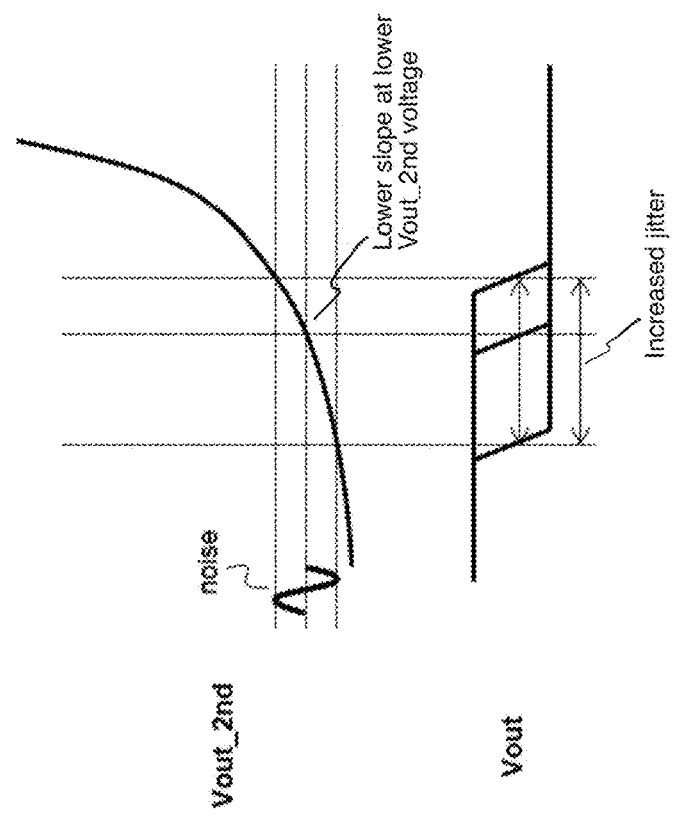
FIG. 3C is a timing diagram that illustrates that when Vout is set to transition at a lower voltage, noise at the Vout_2nd output causes the output jitter at Vout to become larger.

FIGS. 3C-3D are timing diagrams that show the relationship of how noise on the DVDD affects the output jitter on the Vout output. In particular, FIG. 3C illustrates that when Vout is set to transition at a lower Vout_2nd output voltage, which is when the slope or rate of change of the Vout_2nd output voltage is smaller, noise at the DVDD causes the output jitter at Vout to become larger. However, FIG. 3D illustrates that when Vout is set to transition at a higher Vout_2nd output voltage, which is when the slope or rate of change on the Vout_2nd output voltage is higher, the same noise occurring at the DVDD causes smaller output jitter at the Vout output. Indeed, timing variations of precisely when the 3rd stage output Vout flips are affected by noise or voltage variations on DVDD, which are dependent on the slope or rate of change of the voltage at the Vout_2nd output when Vout is set to transition. As shown in FIGS. 3C-3D, output jitter at Vout is reduced when Vout is set to transition at a higher Vout_2nd voltage because there is a higher rate of change or slope in the Vout_2nd voltage accordance with the teachings of the present invention.

Figures 4A, 4B:
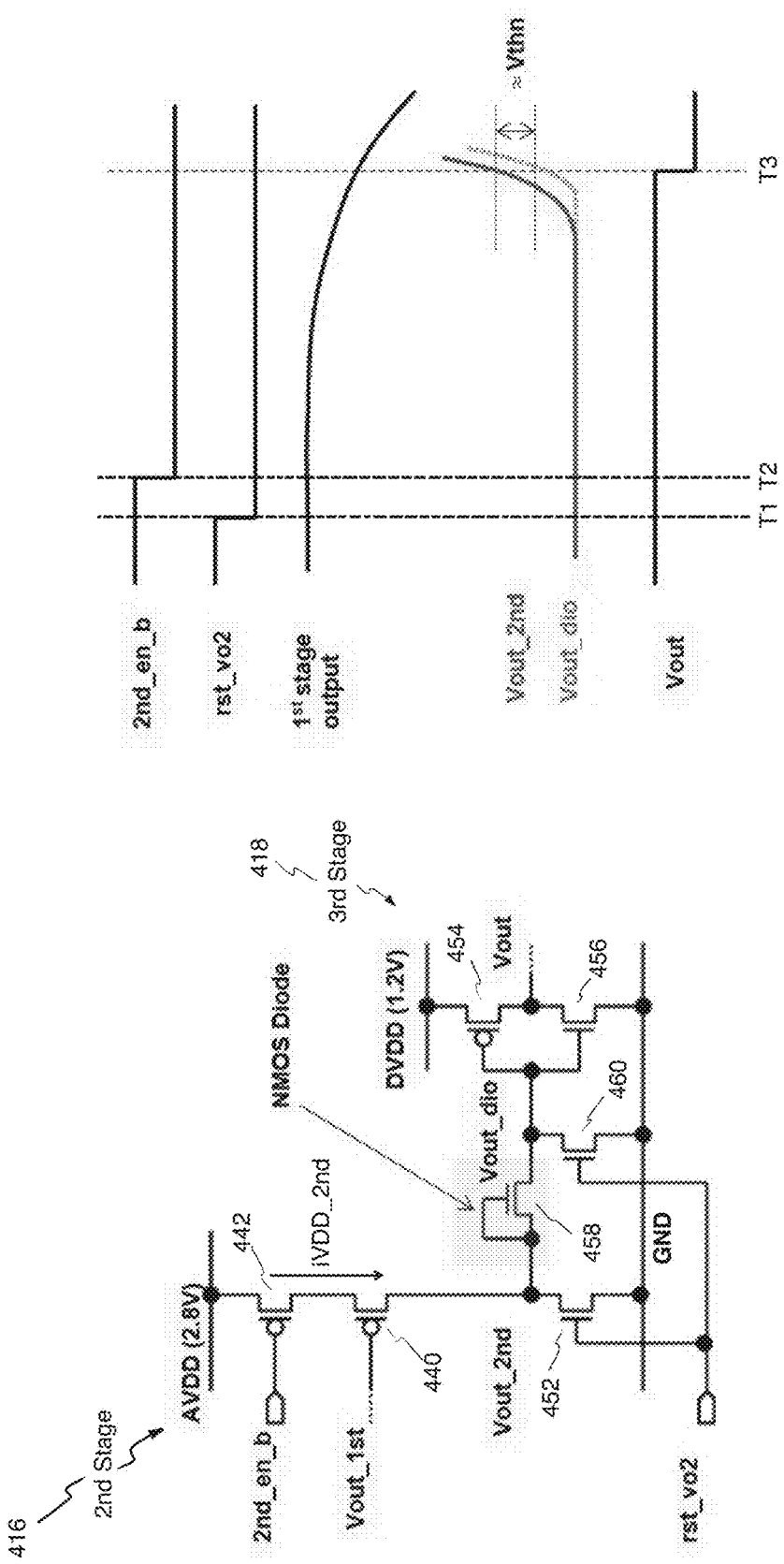
FIG. 4A is a schematic illustrating another example of output circuitry of a comparator including a second stage and a third stage in accordance with the teachings of the present invention.
FIG. 4B is a timing diagram that illustrates some of the signals in a second stage and a third stage as illustrated in FIG. 4A during an analog to digital conversion in accordance with the teachings of the present invention.

FIG. 4A is a schematic illustrating another example of output circuitry of a comparator including a second stage 416 and a third stage 418 in accordance with the teachings of the present invention. It is appreciated that second stage 416 and third stage 418 are additional or alternate examples of second stage 316 and third stage 318 of FIG. 3A and/or second stage 216 and third stage 218 of FIG. 2A, and that similarly named and numbered elements referenced below are coupled and function similar to as described above. Furthermore, it is appreciated that second stage 416 illustrated in FIG. 4A shares many similarities with second stage 316 of FIG. 3A. One difference between second stage 416 illustrated in FIG. 4A and second stage 316 of FIG. 3A is that second stage 416 illustrated in FIG. 4A includes an NMOS diode 458 coupled between the Vout_2nd node of 2nd stage 416 and the input node of the output stage, which is 3rd stage 418. In the example, the NMOS diode 458 is implemented with a diode coupled NMOS transistor with its gate terminal coupled to its drain terminal. Furthermore, an additional transistor 460 is also coupled between the input of the 3rd stage 418 and ground. The transistor 460 is also switched in response to the reset signal rst_vo2, which is used to precharge the Vout_dio output node of the NMOS transistor 458 to ground (GND) prior to analog to digital conversion.

It is appreciated that with the diode coupled NMOS transistor 458, the slope of Vout_2nd and Vout_dio is larger when the signal at the input node of the 3rd stage 418 reaches the threshold voltage of the 3rd stage 418 that causes the output stage to flip, which therefore improves the power supply rejection ratio (PSRR) of the DVDD voltage supply in accordance with the teachings of the present invention. This is because voltage of the Vout_dio output of the NMOS diode 458, which is coupled to the input node of the 3rd stage, is lower than Vout_2nd output of the 2nd stage 418 by a threshold voltage of the NMOS diode 458, which Vthn. As a result, the voltage at the Vout_2nd output of the 2nd stage 416 to flip the 3rd stage 418 is increased by the threshold voltage Vthn of the NMOS diode 458, which delays the of the flipping timing of the 3rd stage 418 to when the slope at the Vout_2nd output of the 2nd stage 416 is higher, in accordance with the teachings of the present invention.

To illustrate, FIG. 4B is a timing diagram that illustrates some of the signals in second stage 416 and third stage 418 as illustrated in FIG. 4A during an analog to digital conversion. It is appreciated that the timing diagram shown in FIG. 4B shares many similarities with the timing diagram illustrated in FIG. 3B. One difference is that the timing diagram in FIG. 4B shows that Vout_2nd is greater than Vout_dio (dashed line) by about the threshold voltage Vthn of the NMOS diode 458 when the 3rd stage flips at time T3 in response to a comparison operation of the comparator. As such, the voltage of Vout_2nd is greater when the 3rd stage 418 flips, which therefore occurs when the slope of the Vout_2nd signal is higher, which therefore reduces output jitter of the 3rd stage output Vout in accordance with the teachings of the present invention. Indeed, with the flipping timing of the 3rd stage 418 being delayed, the slope of the Vout_2nd voltage is increased because Vout_1st voltages also decreases with time as the comparator flips, which causes the 2nd stage 416 current iVDD_2nd to further increase with time. Thus, the slope of the Vout_2nd output of the 2nd stage 416 further increases with time because the slope is determined by 2nd stage current iVDD_2nd over the capacitance on the Vout_2nd output of the second stage 416.

In this way, the 2nd stage current iVDD_2nd when the 3rd stage 418 flips becomes bigger with the addition of the NMOS diode 458 as shown in FIG. 4A. As mentioned, the slope of the Vout_2nd output voltage is determined by the 2nd stage current iVDD_2nd and 2nd stage capacitance. Furthermore, it is appreciated that one of merits of the circuitry included 2nd stage 416 is that the additional capacitance is small. Before the NMOS diode 458 turns on, NMOS diode 458 is off and the Vout_2nd and Vout_dio nodes are disconnected so that total capacitance that can be seen from the 2nd input device 440 is just parasitic capacitance on the Vout_2nd node. After the NMOS diode 458 turns on, the voltage at the Vout_dio node follows the voltage at the Vout_2nd node so that the gate to source capacitance Cgs and the drain to source capacitance Cds look very small due to the Miller effect. If the body of the NMOS diode 458 is connected to ground, the gain from Vout_2nd to Vout_dio is about 85% typically. Therefore, just 15% of the gate to source capacitance Cgs and the drain to source capacitance Cds of the NMOS diode 458 contribute to the slope of Vout_2nd and Vout_dio. All of 2nd stage current, iVDD_2nd, is used to change Vout_2nd voltage so that 2nd stage current iVDD_2nd can be minimized.

Figure 4D:
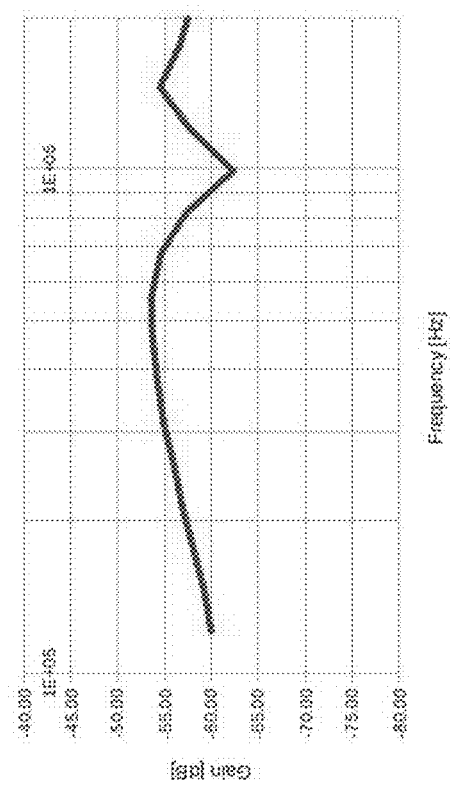
FIG. 4D a diagram that illustrates the power supply rejection ratio (PSRR) of a DVDD voltage supply in an example not including a diode.
Figure 4C:
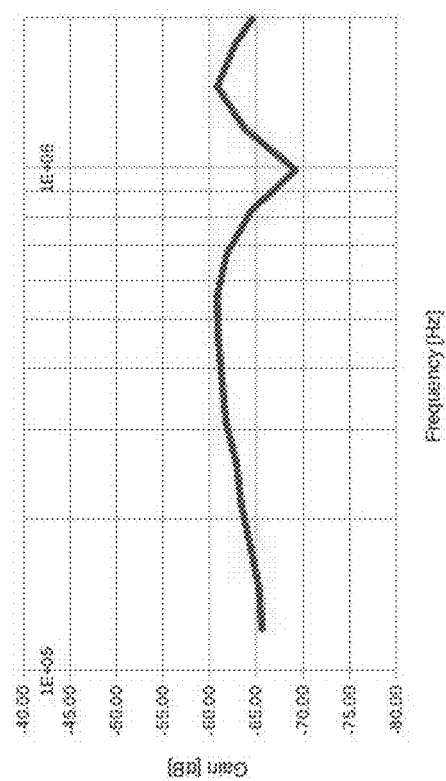
FIG. 4C is a diagram that illustrates the power supply rejection ratio (PSRR) of a DVDD voltage supply in an example including a diode in accordance with the teachings of the present invention.

FIGS. 4C-4D are diagrams that illustrate the improvement in the power supply rejection ratio PSRR of the DVDD voltage supply by including the NMOS diode 458 as shown in FIG. 4A. In particular, FIG. 4C illustrates the PSRR of the DVDD with the NMOS diode 458, and FIG. 4D illustrates the PSRR of the DVDD without the NMOS diode 458. As shown, with the NMOS diode 458, the DVDD PSRR is improved by 6 dB. It is appreciated that the technique implemented by including NMOS diode 458 as shown in FIG. 4A can be applied to systems in which the voltage slope is increased with time in accordance with the teachings of the present invention.

Figure 5B:
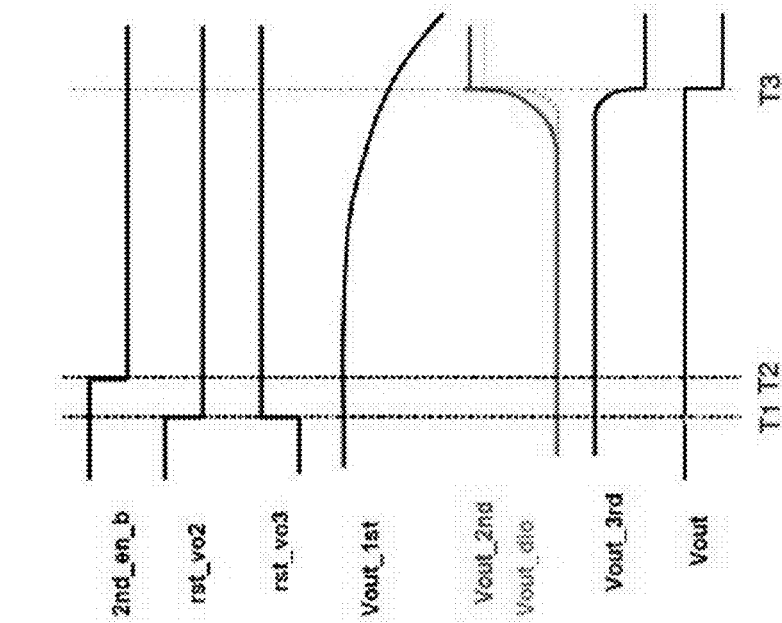
FIG. 5B is a timing diagram that illustrates some of the signals in a second stage and a third stage as illustrated in FIG. 5A during an analog to digital conversion in accordance with the teachings of the present invention.
Figure 5A:
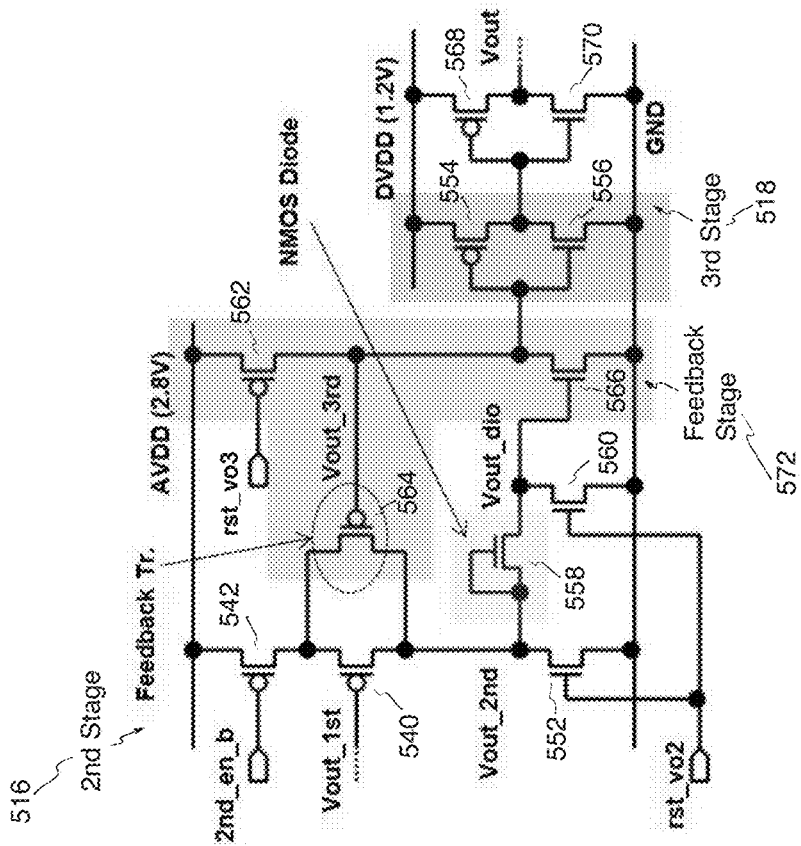
FIG. 5A is a schematic illustrating yet another example of output circuitry of a comparator including a second stage and a third stage in accordance with the teachings of the present invention.

FIG. 5A is a schematic illustrating yet another example of output circuitry of a comparator including a second stage 516 and a third stage 518 in accordance with the teachings of the present invention. It is appreciated that second stage 516 and third stage 518 are additional or alternate examples of second stage 416 and third stage 418 of FIG. 4A, and/or second stage 316 and third stage 318 of FIG. 3A, and/or second stage 216 and third stage 218 of FIG. 2A, and that similarly named and numbered elements referenced below are coupled and function similar to as described above. Furthermore, it is appreciated that second stage 516 and third stage 518 illustrated in FIG. 5A shares many similarities with second stage 416 and third stage 418 of FIG. 4A.

One difference between third stage 518 illustrated in FIG. 5A and third stage 418 of FIG. 4A is that third stage 518 illustrated in FIG. 5A is implemented as a buffer circuit with a pair of inverters that are coupled in series to generate the Vout output of the output stage. As shown, an additional inverter including a PMOS transistor 568 and an NMOS transistor 570 are coupled between DVDD and ground GND. The gate terminals of PMOS transistor 568 and NMOS transistor 570 are coupled to the output of the inverter that includes PMOS transistor 554 and NMOS transistor 556 as shown. The drain terminals of PMOS transistor 568 and NMOS transistor 570 are coupled to generate the Vout output of 3rd stage 518.

One difference between second stage 516 illustrated in FIG. 5A and second stage 416 of FIG. 4A is that second stage 516 illustrated in FIG. 5A includes an additional feedback stage 572 coupled to the input node of the output stage or third stage 518. In the depicted example, the feedback stage 572 includes a PMOS transistor 562 and an NMOS transistor 566 coupled between AVDD and ground GND. The gate terminal of transistor 562 is coupled to be switched in response to another reset signal rst_vo3, and the gate terminal of transistor 566 is coupled to the Vout_dio output node of the NMOS diode 558. Feedback stage 572 also includes a PMOS transistor 564 coupled across transistor 540, which is coupled to receive the Vout_1st signal from the first stage as shown. PMOS transistor 564 may be considered as a feedback transistor having drain and source terminals that are coupled to the respective drain and source terminals of transistor 540. A Vout_3rd output node of the feedback stage 572 is coupled to the control terminal or gate terminal of feedback transistor 564 as well as the gate terminals of transistors 554 and 556 at the input node of the output stage or 3rd stage 518.

In operation, it is appreciated that with feedback transistor 564 being coupled across transistor 540 as shown, positive feedback is provided to 2nd stage 516 in response to the Vout_3rd as shown. Having positive feedback is another way to increase the voltage slope of Vout_2nd when the voltage at the input of the output stage reaches the threshold voltage of the output stage to flip the output stage in accordance with teachings of the present invention. The diode connected NMOS transistor 558 can be implemented together with the positive feedback provided by feedback transistor 564 to improve circuit performance characteristics, such as PSRR. In particular, the feedback transistor pulls up Vout_2nd so that the voltage slope of Vout_2nd is increased significantly with the positive feedback.

To illustrate, FIG. 5B is a timing diagram that illustrates some of the signals in second stage 516 and third stage 518 as illustrated in FIG. 5A during an analog to digital conversion. It is appreciated that the timing diagram shown in FIG. 5B shares many similarities with the timing diagram illustrated in FIG. 4B. One difference is that the timing diagram in FIG. 5B also illustrates the reset signal rst_vo3, which switches at the same time as the reset signal rst_vo2, but with a different polarity such that transistor 562 precharges or pulls the Vout_3rd voltage up to AVDD while Vout_2nd and Vout_dio are precharged or pulled down to ground GND prior to time T1. At time T2, the 2nd stage is enabled in response to the 2nd_en_b signal. FIG. 5B also shows that the slope of Vout_2nd is increased when the comparator flips at time T3 due to the positive feedback when the comparator flips in response to a comparison operation of the comparator.

In the example depicted in FIG. 5A, there is no direct current from AVDD to GND and all of current is used to charge Vout_2nd or Vout_3rd so that 2nd stage 516 current can be minimized. In addition, the voltage slope of Vout_3rd when 3rd stage 518 flips can be increased significantly with the feedback stage so that PSRR of the 3rd stage can be improved. The voltage slope of Vout_2nd or Vout_dio affect the noise immunity of the feedback stage 572. By having the diode connected NMOS transistor 558, the voltage of Vout_ dio (dashed line) follows Vout_2nd as the comparator flips such that the timing of when feedback stage 572 turns on is delayed so that the voltage slope of the input signal can be increased, which increases the noise immunity of the feedback stage in accordance with the teachings of the present invention.

Figures 6A, 6B:
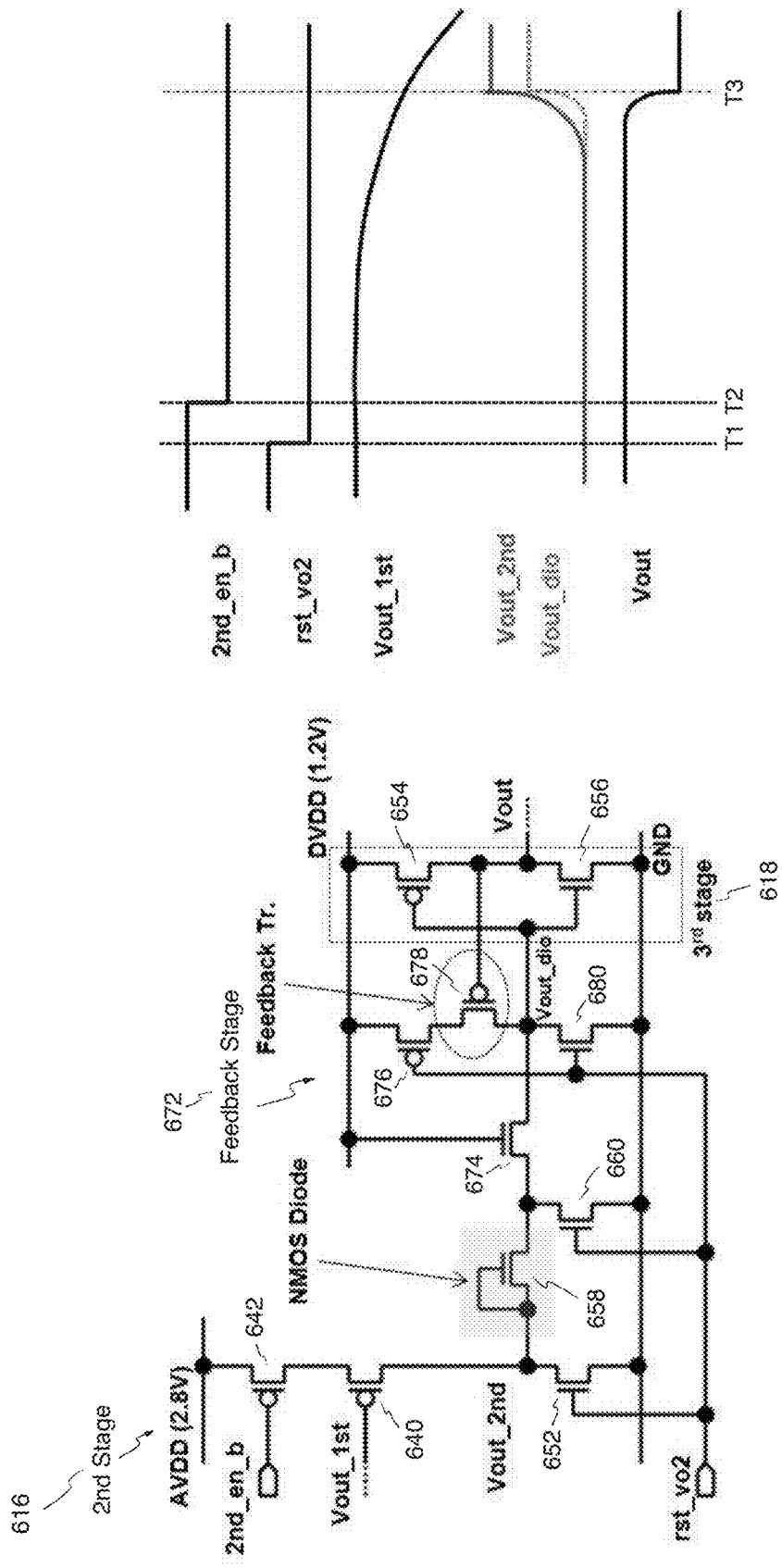
FIG. 6A is a schematic illustrating still another example of output circuitry of a comparator including a second stage and a third stage in accordance with the teachings of the present invention.
FIG. 6B is a timing diagram that illustrates some of the signals in a second stage and a third stage as illustrated in FIG. 6A during an analog to digital conversion in accordance with the teachings of the present invention.

FIG. 6A is a schematic illustrating still another example of output circuitry of a comparator including a second stage 616 and a third stage 618 in accordance with the teachings of the present invention. It is appreciated that second stage 616 and third stage 618 are additional or alternate examples of second stage 516 and third stage 518 of FIG. 5A, and/or second stage 416 and third stage 418 of FIG. 4A, and/or second stage 316 and third stage 318 of FIG. 3A, and/or second stage 216 and third stage 218 of FIG. 2A, and that similarly named and numbered elements referenced below are coupled and function similar to as described above. Furthermore, it is appreciated that second stage 616 illustrated in FIG. 6A also shares many similarities with second stage 416 of FIG. 4A.

One difference between second stage 616 illustrated in FIG. 6A and second stage 416 of FIG. 4A is that second stage 616 illustrated in FIG. 6A also includes additional feedback stage 672 coupled to the input node of the output stage or third stage 618. In the depicted example, feedback stage 672 includes a PMOS transistor 676, a PMOS transistor 678, and an NMOS transistor 680 coupled between a second supply voltage, DVDD, and ground GND. The control terminals or gate terminals of transistors 676 and 680 are coupled to be switched in response to the reset signal rst_vo2. During operation, transistor 678 is configured to decouple the transistor 678 from DVDD, and transistor 680 is configured to couple the input node of the 3rd stage 618 to ground in response to the reset signal rst_vo2. The control terminal or gate terminal of transistor 678, which may be considered as a feedback transistor, is coupled to the Vout output node of the 3rd stage 618. The node between transistors 678 and 680 is coupled to the input node to the output stage or 3rd stage 618. An NMOS transistor 674 is coupled between the NMOS diode transistor 658 and the input to the output stage or 3rd stage 618. The control terminal or gate terminal of transistor 674 is tied to DVDD.

It is appreciated that the example feedback stage 672 shown in FIG. 6A is an alternative to feedback stage 572 example illustrated in FIG. 5A. To illustrate, FIG. 6B is a timing diagram that illustrates some of the signals in second stage 616 and third stage 618 as illustrated in FIG. 6A during an analog to digital conversion. It is appreciated that the timing diagram shown in FIG. 6B shares many similarities with the timing diagram illustrated in FIG. 5B. One difference is that the timing diagram in FIG. 6B no longer includes the reset signal rst_vo3 or the Vout_3rd signal. However, FIG. 6B still includes the reset signal rst_vo2, which turns on transistors 652, 660, and 680 to precharge or pull the nodes labeled Vout_2nd and Vout_dio, as well as the output terminal of the NMOS diode transistor 658 to ground GND prior to time T1. At time T2, the 2nd stage is enabled in response to the 2nd_en_b signal. FIG. 6B also shows that the slope of Vout_2nd is increased when the comparator flips at time T3 with the feedback that is provided when the comparator flips in response to a comparison operation of the comparator, which occurs when the signal at the input of the output stage or 3rd stage 618 reaches the threshold voltage of the 3rd stage.

In the example depicted in FIG. 6A, the supply voltage for the feedback transistor 678 is the second supply voltage, DVDD, instead of the first supply voltage, AVDD. In the depicted example, the second supply voltage DVDD (e.g., 1.2 V) is less than the first supply voltage AVDD (e.g., 2.8 V). The flipping operation of the 3rd stage 618 shares many similarities with the previously described example. In particular, when the voltage at Vout_dio at the input node of the 3rd stage 618 exceeds the threshold of the 3rd stage 618, the Vout output node of the third stage 618 goes low, which turns on the feedback transistor 678, which pulls up the Vout_dio node even more quickly so that the voltage slope at time T3 can be increased. In addition, with the inclusion of the diode connected NMOS transistor 658, the voltage of Vout_dio (dashed line) follows Vout_2nd when the comparator flips such that the timing of when third stage 618 is delayed so that the voltage slope of the input signal can be increased, which increases the noise immunity in accordance with the teachings of the present invention.

The above description of illustrated examples of the invention, including what is described in the Abstract, is not intended to be exhaustive or to limit the invention to the precise forms disclosed. While specific examples of the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific examples disclosed in the specification. Rather, the scope of the invention is to be determined entirely by the following claims, which are to be construed in accordance with established doctrines of claim interpretation.

What is claimed is:

1. An output circuit for use with a comparator, comprising:
   a first transistor having a control terminal coupled to receive an output signal from a first stage of the comparator;
   a second transistor coupled between the first transistor and a reference voltage, wherein the second transistor has a control terminal coupled to receive a first reset signal, wherein the second transistor is coupled to precharge a first output node of the first transistor between the first and second transistors to the reference voltage prior to a comparison operation of the comparator; and
   an output stage having an input node coupled to the first output node, wherein the output stage is coupled to generate an output voltage of the output circuit at an output node of the output stage in response to the first output node.

2. The output circuit of claim 1, further comprising a third transistor coupled between a first supply voltage and the first transistor, wherein the third transistor has a control terminal coupled to receive a first enable signal, wherein the third transistor is configured to couple the first transistor to the first supply voltage after the first output node has been precharged to the reference voltage and prior to the comparison operation of the comparator.

3. The output circuit of claim 1, wherein the output stage comprises an inverter coupled between a second supply voltage and the reference voltage, wherein the second supply voltage is less than the first supply voltage, wherein the inverter is coupled to generate the output voltage of the output circuit in response to the first output node.

4. The output circuit of claim 1, wherein the output stage comprises a buffer circuit coupled between a second supply voltage and the reference voltage, wherein the second supply voltage is less than the first supply voltage, wherein the buffer circuit is coupled to generate the output voltage of the output circuit in response to the first output node.

5. The output circuit of claim 1, further comprising a diode coupled between the first output node and the input node of the output stage, wherein the diode is coupled to increase a slope of a signal received at the input node of the output stage when the signal reaches a threshold voltage of the output stage.

6. The output circuit of claim 5, wherein the diode comprises a diode coupled NMOS transistor.

7. The output circuit of claim 5, further comprising a fourth transistor coupled between an output node of the diode and the reference voltage, wherein the fourth transistor has a control terminal coupled to receive the first reset signal, wherein the fourth transistor is coupled to precharge the output node of the diode to the reference voltage prior to the comparison operation of the comparator.

8. The output circuit of claim 5, further comprising a feedback stage coupled to the input node of the output stage, wherein the feedback stage is coupled to further increase the slope of the signal received at the input node of the output stage when the signal reaches the threshold voltage of the output stage.

9. The output circuit of claim 8, wherein the feedback stage comprises:
a fifth transistor coupled between the input node of the output stage and the reference voltage, wherein the fifth transistor has a control terminal coupled to the output node of the diode; and
a sixth transistor coupled across the first transistor, wherein the sixth transistor has a control terminal coupled to the input node of the output stage, wherein the sixth transistor is coupled to be enabled in response to the signal received at the input node of the output stage to further increase the slope of the signal received at the input node of the output stage when the signal reaches the threshold voltage of the output stage.

10. The output circuit of claim 9, further comprising a seventh transistor coupled between the first supply voltage and the input node of the output stage, wherein the seventh transistor has a control terminal coupled to receive a second reset signal, wherein the seventh transistor is coupled to precharge the input terminal of the output stage to the first supply voltage prior to the comparison operation of the comparator.

11. The output circuit of claim 8, wherein the feedback stage comprises:
an eighth transistor coupled between the input node of the output stage and the reference voltage, wherein the eighth transistor has a control terminal coupled to receive the first reset signal; and
a ninth transistor coupled to the input node of the output stage, wherein the ninth transistor has a control terminal coupled to the output node of the output stage, wherein the ninth transistor is coupled to further increase the slope of the signal received at the input node of the output stage when the signal reaches the threshold voltage of the output stage.

12. The output circuit of claim 11, further comprising a tenth transistor coupled between a second supply voltage and the ninth transistor, wherein the tenth transistor is configured to decouple the ninth transistor to the second supply voltage in response to the second reset signal.

13. The output circuit of claim 12, further comprising an eleventh transistor coupled between an output node of the diode and the input node of the output stage, wherein the eleventh transistor has a control terminal tied to the second supply voltage.

14. An imaging system, comprising:
an array of pixels to receive image light and generate an image charge voltage signal in response; and
readout circuitry coupled to the receive the image charge voltage signal from the array of pixels and provide a digital representation of the image charge voltage signal in response, the readout circuitry including a comparator to receive the image charge, compare the image charge voltage signal to a reference voltage, and provide the digital representation of the image charge voltage signal in response, wherein the comparator comprises:
a first stage coupled to receive the image charge and the reference voltage and provide a first stage output signal in response;
a second stage including;
a first transistor having a control terminal coupled to receive the first stage output signal; and
a second transistor coupled between the first transistor and a reference voltage, wherein the second transistor has a control terminal coupled to receive a first reset signal, wherein the second transistor is coupled to precharge a first output node of the first transistor between the first and second transistors to the reference voltage prior to a comparison operation of the comparator; and
a third stage having an input node coupled to the first output node, wherein the third stage is coupled to generate an output voltage of the comparator at an output node of the third stage in response to the first output node.

15. The imaging system of claim 14, wherein the second stage further includes a third transistor coupled between a first supply voltage and the first transistor, wherein the third transistor has a control terminal coupled to receive a first enable signal, wherein the third transistor is configured to couple the first transistor to the first supply voltage after the first output node has been precharged to the reference voltage and prior to the comparison operation of the comparator.

16. The imaging system of claim 14, wherein the third stage comprises an inverter coupled between a second supply voltage and the reference voltage, wherein the second supply voltage is less than the first supply voltage, wherein the inverter is coupled to generate the output voltage of the comparator in response to the first output node.

17. The imaging system of claim 14, wherein the third stage comprises a buffer circuit coupled between a second supply voltage and the reference voltage, wherein the second supply voltage is less than the first supply voltage, wherein the buffer circuit is coupled to generate the output voltage of the comparator in response to the first output node.

18. The imaging system of claim 14, wherein the second stage further includes a diode coupled between the first output node and the input node of the third stage, wherein the diode is coupled to increase a slope of a signal received at the input node of the third stage when the signal reaches a threshold voltage of the third stage.

19. The imaging system of claim 18, wherein the diode comprises a diode coupled NMOS transistor.

20. The imaging system of claim 18, wherein the second stage further includes a fourth transistor coupled between an output node of the diode and the reference voltage, wherein the fourth transistor has a control terminal coupled to receive the first reset signal, wherein the fourth transistor is coupled to precharge the output node of the diode to the reference voltage prior to the comparison operation of the comparator.

21. The imaging system of claim 18, wherein the comparator further includes a feedback stage coupled to the input node of the third stage, wherein the feedback stage is coupled to further increase the slope of the signal received at the input node of the third stage when the signal reaches the threshold voltage of the third stage.

22. The imaging system of claim 21, wherein the feedback stage comprises:
- a fifth transistor coupled between the input node of the third stage and the reference voltage, wherein the fifth transistor has a control terminal coupled to the output node of the diode; and
- a sixth transistor coupled across the first transistor, wherein the sixth transistor has a control terminal coupled to the input node of the third stage, wherein the sixth transistor is coupled to be enabled in response to the signal received at the input node of the third stage to further increase the slope of the signal received at the input node of the third stage when the signal reaches the threshold voltage of the third stage.

23. The imaging system of claim 22, further comprising a seventh transistor coupled between the first supply voltage and the input node of the third stage, wherein the seventh transistor has a control terminal coupled to receive a second reset signal, wherein the seventh transistor is coupled to precharge the input terminal of the third stage to the first supply voltage prior to the comparison operation of the comparator.

24. The imaging system of claim 21, wherein the feedback stage comprises:
- an eighth transistor coupled between the input node of the third stage and the reference voltage, wherein the eighth transistor has a control terminal coupled to receive the first reset signal; and
- a ninth transistor coupled to the input node of the third stage, wherein the ninth transistor has a control terminal coupled to the output node of the third stage, wherein the ninth transistor is coupled to further increase the slope of the signal received at the input node of the third stage when the signal reaches the threshold voltage of the third stage.

25. The imaging system of claim 24, further comprising a tenth transistor coupled between a second supply voltage and the ninth transistor, wherein the tenth transistor is configured to decouple the ninth transistor to the second supply voltage in response to the second reset signal.

26. The imaging system of claim 25, further comprising an eleventh transistor coupled between an output node of the diode and the input node of the third stage, wherein the eleventh transistor has a control terminal tied to the second supply voltage.

* * * * *